United States Patent
Bybell

(10) Patent No.: US 7,181,661 B2
(45) Date of Patent: Feb. 20, 2007

(54) METHOD AND SYSTEM FOR BROADCASTING DATA TO MULTIPLE TAP CONTROLLERS

(75) Inventor: Anthony J. Bybell, Carrboro, NC (US)

(73) Assignee: International Business Machines Corporation, Armonk, NY (US)

( * ) Notice: Subject to any disclaimer, the term of this patent is extended or adjusted under 35 U.S.C. 154(b) by 393 days.

(21) Appl. No.: 10/771,658

(22) Filed: Feb. 4, 2004

(65) Prior Publication Data

US 2005/0172183 A1    Aug. 4, 2005

(51) Int. Cl.
*G01R 31/28* (2006.01)

(52) U.S. Cl. ..................................................... 714/724
(58) Field of Classification Search ................ None
See application file for complete search history.

(56) References Cited

U.S. PATENT DOCUMENTS

| | | | | |
|---|---|---|---|---|
| 4,872,169 A | * | 10/1989 | Whetsel, Jr. ................. | 714/727 |
| 5,323,107 A | * | 6/1994 | D'Souza ..................... | 324/754 |
| 5,483,518 A | * | 1/1996 | Whetsel ..................... | 370/241 |
| 5,596,734 A | | 1/1997 | Ferra | |
| 6,311,302 B1 | | 10/2001 | Cassetti et al. | |
| 6,334,198 B1 | | 12/2001 | Adusumilli et al. | |
| 6,363,510 B1 | | 3/2002 | Rhodes et al. | |
| 6,385,749 B1 | * | 5/2002 | Adusumilli et al. ........ | 714/733 |
| 6,490,641 B2 | | 12/2002 | Whetsel | |
| 6,526,498 B1 | | 2/2003 | Mirsky et al. | |
| 2002/0157050 A1 | | 10/2002 | Whetsel | |

FOREIGN PATENT DOCUMENTS

DE    199 45 900 A 1    4/2001

OTHER PUBLICATIONS

VariCore™ Embedded Programmable Gate Array Core (EPGA™) 0.18 μm Family, Release 2.2 Dec. 2001, Actel Corporation.
Green Hills Probe, Green Hills Software, Inc., copyright 2001.
ARM Innovation, Solving Complexity, New Tool Delivers Multi-Core, Mixed Architecture Debugging and OS Awareness, Spring 2002, pp. 1-8.
3 Memory and Register Map, TigerSHARC DSP Hardware Specification, pp. 3-1 through 3-56.

* cited by examiner

*Primary Examiner*—Phung My Chung
(74) *Attorney, Agent, or Firm*—Sawyer Law Group LLP

(57) ABSTRACT

A method and system for testing a plurality of cores in an integrated circuit is disclosed. The method and system include providing a plurality of slave controllers a master controller. Each of the plurality of slave controllers is for testing at least one of the plurality of cores. The master controller is coupled with the plurality of slave controllers in a star configuration. The master controller is configured to allow test data to be input directly to a portion of the plurality of slave controllers in parallel. The portion of the plurality of slave controllers can include more than one slave controller.

17 Claims, 4 Drawing Sheets

METHOD AND SYSTEM FOR BROADCASTING DATA TO MULTIPLE TAP CONTROLLERS

FIELD OF THE INVENTION

The present invention relates to integrated circuits, and more particularly to a method and system for more efficiently testing portions of the integrated circuits.

BACKGROUND OF THE INVENTION

Currently, the trend in integrated circuits is to more complex designs. For example, an integrated circuit may have previously included only a single core, such as processor circuit. Currently, integrated circuits are often designed with multiple cores having relatively complex interconnections. Thus, it is desirable to test integrated circuits during design and fabrication.

The IEEE 1149.1 JTAG recommendation provides a standard test architecture for use with integrated circuits. The JTAG recommendation provides that a core can be coupled with a test access port (TAP) controller used in testing various features of a core. As used herein, a core is a portion of an integrated circuit that can be tested using a controller. The core need not include a single processor or a particular set of circuits in an integrated circuit. Although JTAG provides a standardized test architecture, one of ordinary skill in the art will readily recognize that JTAG envisions a single core being tested by a single controller.

FIG. 1A depicts a conventional system 10 for testing an integrated circuit having multiple cores. Thus, multiple slave TAP controllers 20, 30, 40, and 50 as well as a conventional master TAP controller 60 are provided. The conventional slave TAP controllers 20, 30, 40, and 50 are cascaded. Consequently, data input to one conventional slave TAP controller 20, 30, and 40 can be cascaded to a subsequent conventional slave TAP controller 30, 40, and 50, respectively. Furthermore, each conventional slave TAP controller 20, 30, 40, and 50 is coupled to a core of an integrated circuit (not shown). Typically, the conventional master TAP controller 60 enables only one of the conventional slave TAP controllers 20, 30, 40, or 50 at a single time. Test data and instructions are transferred to the conventional slave TAP controller 20, 30, 40, or 50 that is enabled. When the transfer of data is complete, the conventional slave TAP controller 20, 30, 40, or 50 is disabled and the next conventional slave TAP controller is enabled. For example, suppose data is to be provided to the cores coupled to the conventional slave TAP controllers 20 and 30. Typically, the conventional slave TAP controller 20 is enabled. Test data is provided to the conventional slave TAP controller 20. The conventional slave TAP controller 20 is then disabled and the conventional slave TAP controller 30 is enabled. If the same test data is provided to both conventional slave TAP controllers 20 and 30, the test data is then cascaded from the conventional slave TAP controller 20 to the conventional slave TAP controller 30. If different test data is provided to the conventional slave TAP controller 30, then the new test data is input directly to the conventional slave TAP controller 30. In some conventional systems 10, the conventional master TAP controller 60 does allow for more than one of the conventional TAP controllers 20, 30, 40, and 50 to be enabled simultaneously. However, test data is still apparently cascaded between the conventional slave TAP controllers 20, 30, 40, and 50. Thus, in the example above, the time taken to serially disable the conventional slave TAP controller 20 and enable the next conventional slave TAP controller 30 is saved. However, the latency in receiving the test data still differs for different TAP controllers because the data is cascaded or received serially. Thus, testing may be slower.

Accordingly, what is needed is a system and method for more rapidly testing integrated circuits. The present invention addresses such a need.

SUMMARY OF THE INVENTION

The present invention provides a method and system for testing a plurality of cores in an integrated circuit. The method and system include providing a plurality of slave controllers a master controller. Each of the plurality of slave controllers is for testing at least one of the plurality of cores. The master controller is coupled with the plurality of slave controllers in a star configuration. The master controller is configured to allow test data to be input directly to a portion of the plurality of slave controllers in parallel. The portion of the plurality of slave controllers can include more than one slave controller.

According to the system and method disclosed herein, the present invention provides a mechanism for simultaneously providing data to multiple slave controllers and, therefore, multiple cores, thereby reducing the amount of time to test the destinations.

DETAILED DESCRIPTION OF THE INVENTION

The present invention relates to an improvement in testing of integrated circuits. The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiments. Thus, the present invention is not intended to be limited to the embodiment shown, but is to be accorded the widest scope consistent with the principles and features described herein.

The present invention provides a method and system for testing a plurality of cores in an integrated circuit. The method and system include providing a plurality of slave controllers a master controller. Each of the plurality of slave controllers is for testing at least one of the plurality of cores. The master controller is coupled with the plurality of slave controllers in a star configuration. The master controller is configured to allow test data to be input directly to a portion of the plurality of slave controllers in parallel. The portion of the plurality of slave controllers can include more than one slave controller.

The present invention will be described in terms of a particular integrated circuit and a particular testing system having a master controller and a certain number of slave controllers. However, one of ordinary skill in the art will readily recognize that this method and system will operate effectively for other integrated circuits and other testing systems. For example, the method and system are consistent with the use of multiple master controllers and another number of slave controllers used in testing integrated circuits. Furthermore, the present invention is described in the context of a particular encoding scheme. However, one of ordinary skill in the art will readily recognize that the method and system can be used with other encoding schemes.

Currently, a JTAG system for testing integrated circuits which uses a master TAP controller coupled with slave TAP controllers in a star configuration is known. In a star configuration, each of the slave TAP controllers is coupled to the master tap controller, but is not directly coupled to each other. This configuration allows for a constant latency to be achieved in providing test data to each slave TAP controller. However, because each slave TAP controller is enabled serially, the transfer of data may be time consuming.

Figure 1:
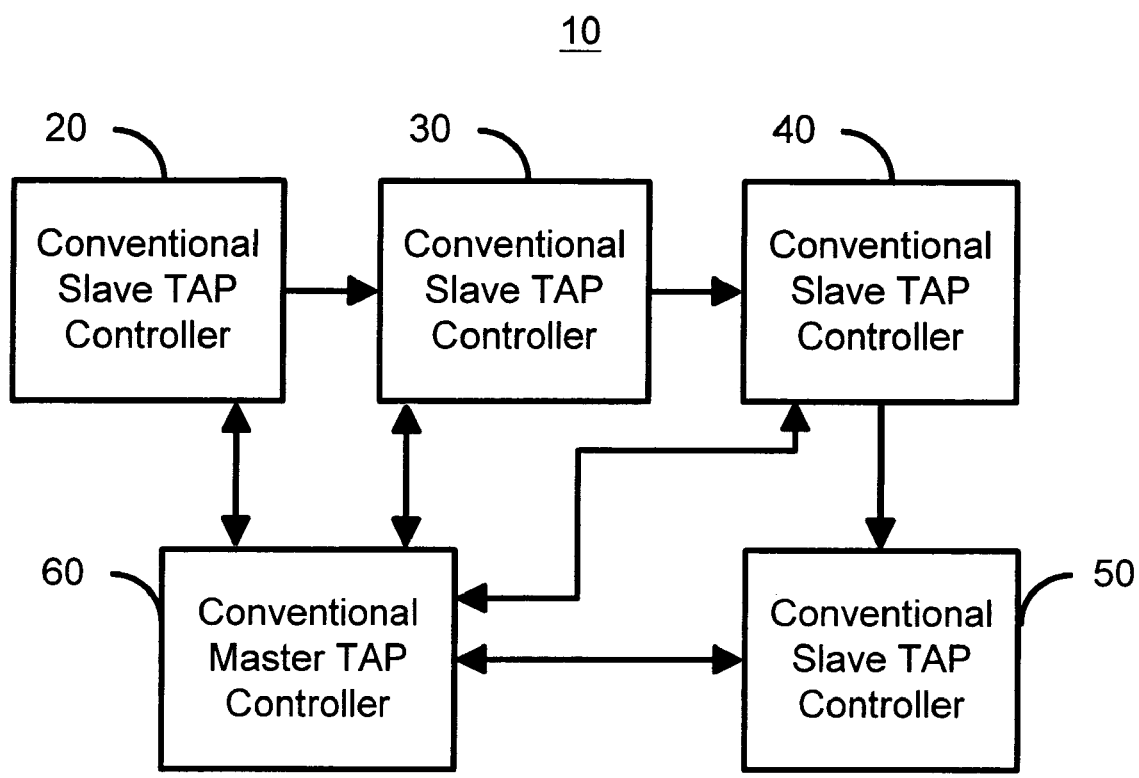
FIG. 1 is a diagram of a conventional system for testing integrated circuits using the JTAG recommendation.
Figure 2:
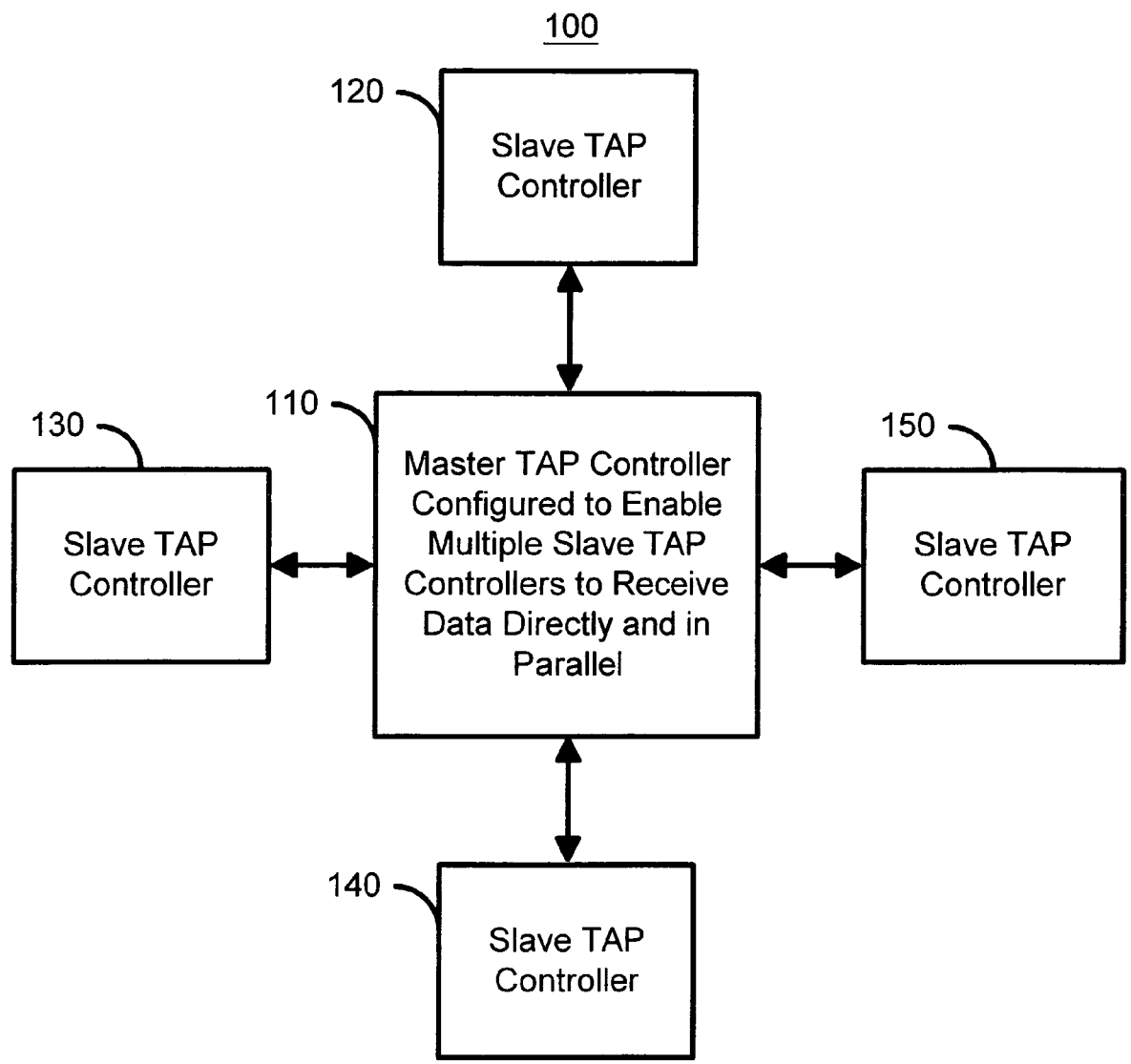
FIG. 2 is a high level block diagram of one embodiment of a system in accordance with the present invention for testing integrated circuits.

To more particularly illustrate the method and system in accordance with the present invention, refer now to FIG. 2, depicting a high level block diagram of one embodiment of a system 100 in accordance with the present invention for testing integrated circuits. The system 100 includes a master TAP controller 110, and slave TAP controllers 120, 130, 140, and 150. Although one master TAP controller 110 and four slave TAP controllers 120, 130, 140, and 150 are depicted, nothing prevents the use of another number of master TAP controllers 110 and/or another number (greater than one) of slave TAP controllers 120, 130, 140, and 150. The slave TAP controllers 120, 130, 140, and 150 are coupled to cores (not shown) of an integrated circuit (not shown), preferably using standard JTAG architecture. The master TAP controller 110 and the slave TAP controllers 120, 130, 140, and 150 are coupled in a star configuration. As used herein, a star configuration is one in which the slave TAP controllers 120, 130, 140, and 150 are coupled with the master TAP controller 110, but are not directly coupled to each other.

The master TAP controller 110 is configured to allow one or more of the slave TAP controllers 120, 130, 140, and 150 to be enabled at the same time such that the more than one of the slave TAP controllers 120, 130, 140, and 150 can directly receive test data in parallel (e.g. at substantially the same time). When the test data is input directly to a slave TAP controller 120, 130, 140, or 150, the test data does not flow to another slave TAP controller 120, 130, 140, or 150 prior to flowing to a particular slave TAP controller 120, 130, 140, or 150. Stated differently, test data is not cascaded between the slave TAP controllers 120, 130, 140, and 150. Thus, the slave TAP controllers 120, 130, 140, and 150 may receive their test data in parallel, at substantially the same time. In a preferred embodiment, the master TAP controller 110 enables some portion of the slave TAP controllers 120, 130, 140, and 150 by using encoded addresses. In a preferred embodiment, the encoded address is split into two portions. The first portion of the encoded address includes a broadcast bit that indicates whether the test data is to be provided to more than one of the slave TAP controllers 120, 130, 140, and 150. If so, then the second portion of the encoded address is a mask indicating the specific slave TAP controllers 120, 130, 140, and 150 that should be enabled. If not, then the second portion of the encoded address is the address of a specific one of the slave TAP controllers 120, 130, 140, or 150. For example, suppose that a transmission includes 1 0011 abcd. The encoded address is 1 0011, while the test data is abcd. The first bit, 1, is the broadcast bit indicating that more than one of the slave TAP controllers 120, 130, 140, and 150 is to be enabled. The mask 0011 indicates which of the slave TAP controllers 120, 130, 140, and 150 are to be enabled. The test data abcd is then provided to the enabled TAP controllers 120, 130, 140, and 150. Note that although an encoded address, preferably using a broadcast bit, and a particular coding scheme is preferred, nothing prevents the use of another mechanism for enabling some portion of the TAP controllers 120, 130, 140, and 150.

Using the system 100, multiple slave TAP controllers 120, 130, 140, and 150 can be enabled simultaneously so that they receive data directly and, preferably, in parallel. Thus, a constant latency can be achieved and the cores can be tested more rapidly.

Figure 3:
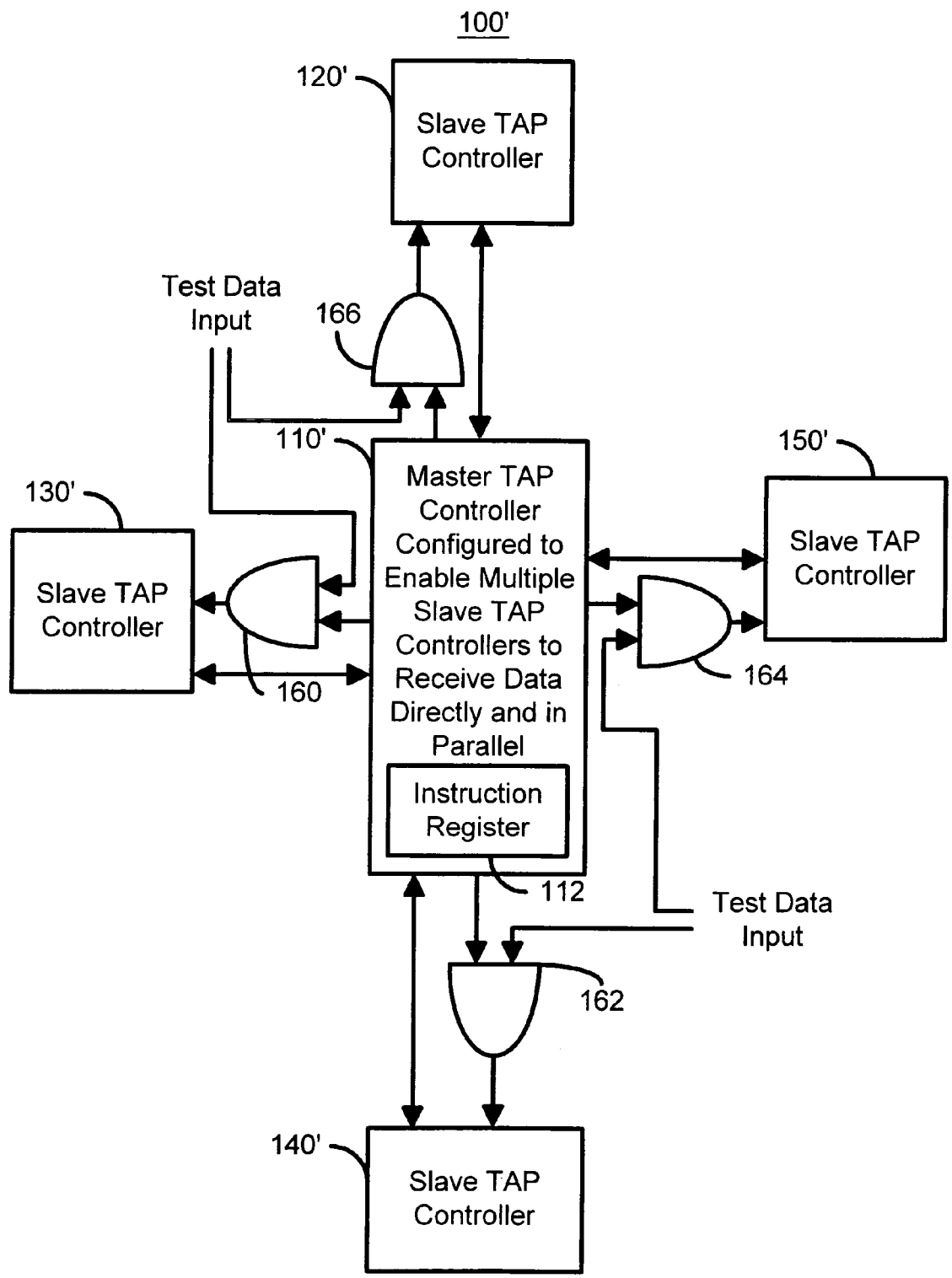
FIG. 3 is a more detailed block diagram of one embodiment of a system in accordance with the present invention for testing integrated circuits.

FIG. 3 is a more detailed block diagram of one embodiment of a system 100' in accordance with the present invention for testing integrated circuits. The system 100' corresponds to the system 100. Consequently, analogous components are labeled similarly. For example, the master TAP controller 110' corresponds to the master TAP controller 110. The master TAP controller 110' is depicted as including an instruction register 112. The system 100' also includes AND gates 160, 162, 164, and 166. The AND gates 160, 162, 164 and 166 have inputs from the master TAP controller 110' and the test data input. The slave TAP controllers 120', 130', 140', and 150' are also connected with cores (not shown) of an integrated circuit being tested.

The master TAP controller 110' is configured to allow one or more of the slave TAP controllers 120', 130', 140', and 150' to be enabled at the same time such that the more than one of the slave TAP controllers 120, 130, 140, and 150 can directly receive test data, preferably in parallel. As discussed above, when the test data is input directly to a slave TAP controller 120', 130', 140', or 150', the test data does not flow to another slave TAP controller 120', 130', 140', or 150' prior to flowing to a particular slave TAP controller '120, '130, '140, or '150. Thus, the slave TAP controllers 120', 130', 140', and 150' may receive their test data in parallel, at substantially the same time.

In operation, the master TAP controller 110' enables the slave TAP controller(s) 120', 130', 140', and/or 150' by enabling the corresponding AND gate 160, 162, 164, and/or 166. The slave TAP controllers 120', 130', 140', and/or 150' can thus receive test data from the test data inputs in parallel through the AND gates 160, 162, 164, and 166, respectively. In a preferred embodiment, the encoded address described above is used. The master TAP controller 110' provides the encoded address to the instruction register 112. Also in a preferred embodiment, the first bit of the encoded address provided to the instruction register 112 is the broadcast bit. The mask/address is then provided to the instruction register 112. Based on the encoded address, one or more of the AND gates 160, 162, 164, and/or 166 is enabled. In addition, multiple AND gates 160, 162, 164, and 166 could be enabled at the same time. Thus, test data can be directly input to the multiple slave TAP controllers 120', 130', 140', and/or 150' through the AND gates 160, 162, 164, and/or 166, respectively, in parallel.

Using the system 100', multiple slave TAP controllers 120', 130', 140', and 150' can be enabled simultaneously so that they receive data directly and, preferably, in parallel. Thus, a constant latency can be achieved and the cores can be tested more rapidly.

Figure 4:
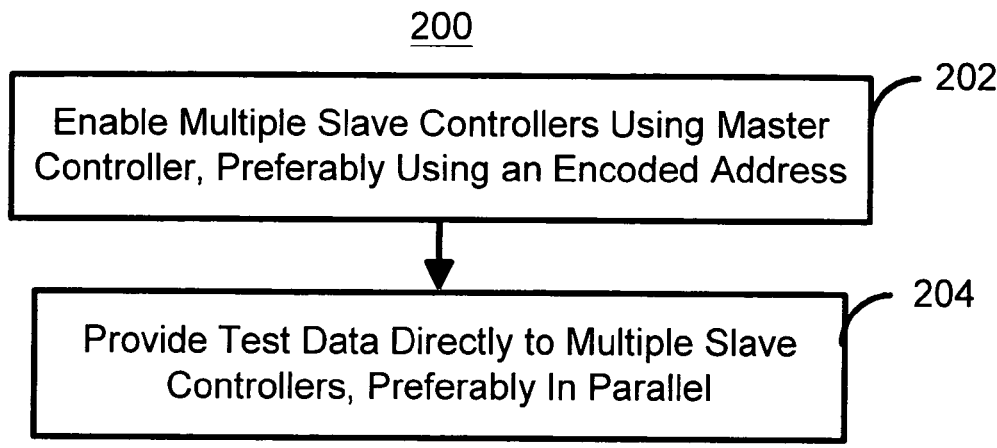
FIG. 4 is a high-level flow chart depicting one embodiment of a method in accordance with the present invention for testing integrated circuits.

FIG. 4 is a high-level flow chart depicting one embodiment of a method 200 in accordance with the present invention for testing integrated circuits. The method 200 is described in the context of the system 100'. However, one of ordinary skill in the art will readily recognize that the method 200 is applicable to other systems. The method 200 is preferably used when the same test data is to be provided to multiple cores. Multiple ones of the slave TAP controllers 120', 130', 140', and 150' are enabled preferably using the master TAP controller 110', via step 202. Thus, step 202 enables the appropriate slave TAP controllers 120', 130', 140', and/or 150' to receive data. In a preferred embodiment, step 202 is performed by providing an encoded address including a broadcast bit to the instruction register 112 and enabling multiple AND gates 160, 162, 164, and/or 166. Test data is provided directly to multiple slave controllers 120', 130', 140', and/or 150', preferably in parallel, via step 204. Step 204 is preferably performed by providing data to the AND gates 160, 162, 164, and 166. Consequently, the enabled AND gates 160, 162, 164, and/or 166 provide data to the corresponding slave TAP controllers 120', 130', 140', and/or 150', respectively. As a result, test data can be provided in parallel to the slave TAP controllers 120', 130', 140', and/or 150' and the cores to which they are coupled. Consequently, testing of the integrated circuit can be made more efficient.

Figure 5:
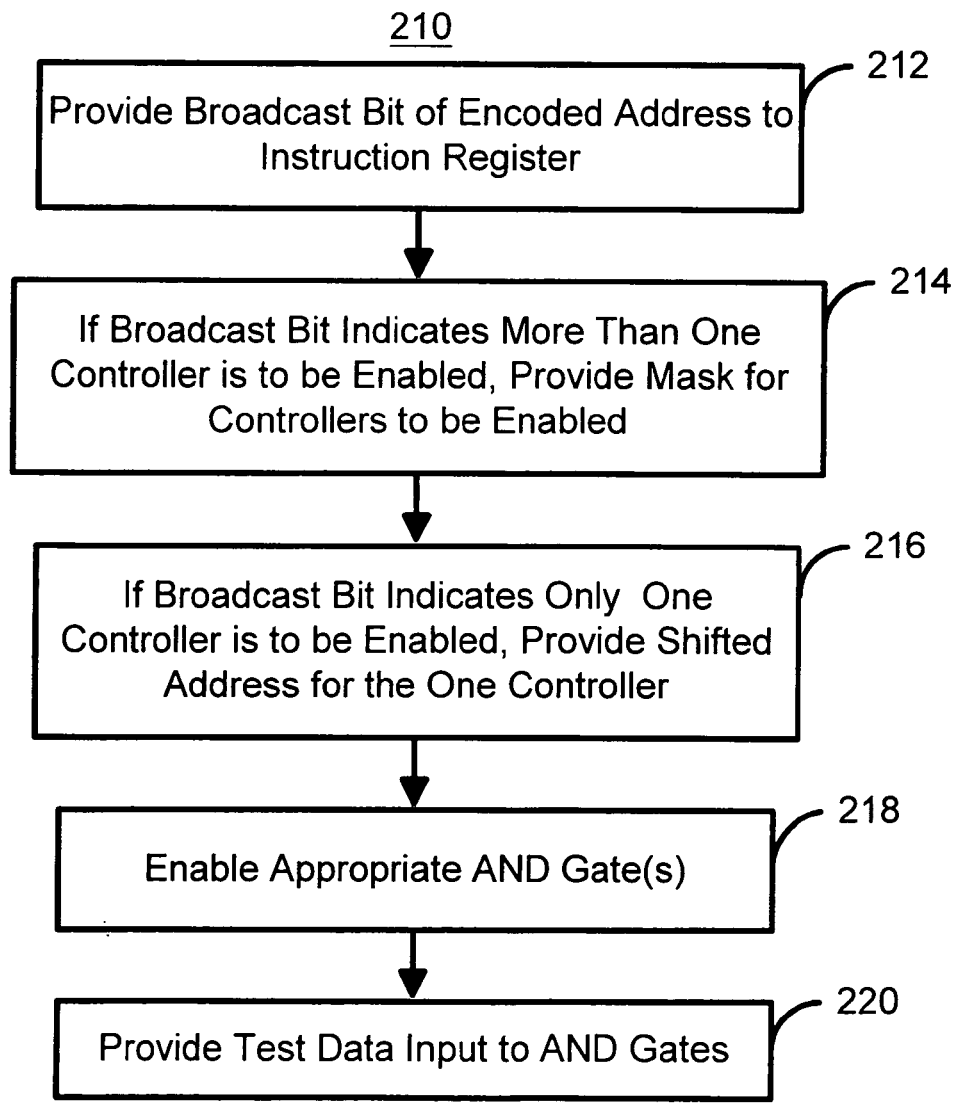
FIG. 5 is a more detailed flow chart of one embodiment of a method in accordance with the present invention for testing integrated circuits.

FIG. 5 is a more detailed flow chart of one embodiment of a method 210 in accordance with the present invention for testing integrated circuits. The method 210 is described in the context of the system 100'. However, one of ordinary skill in the art will readily recognize that the method 210 is applicable to other systems. The broadcast bit of the encoded address is provided to the instruction register 112, via step 212. If the broadcast bit indicates that more than one controller is to be enabled, then a mask indicating the slave TAP controllers 120', 130', 140', and/or 140' is provided to the instruction register 112, via step 214. If the broadcast bit indicates that only one controller is to be enabled, then an address indicating the slave TAP controller 120', 130', 140', or 140' is provided to the instruction register 112, via step 216. Thus, via step 212–216, the encoded address is provided. The appropriate AND gate(s) 160, 162, 164, and/or 166 are enabled using the encoded address, via step 218. Thus, step 218 can be viewed as enabling the appropriate slave controller(s) 120', 130', 140', and/or 150' coupled to the appropriate AND gate(s) 160, 162, 164, and 166, respectively. The test data is provided to the AND gates 160, 162, 164, and 166, via step 220. Thus, the enabled AND gate(s) 160, 162, 164, and 166 will transmit the data to the appropriate slave TAP controller(s) 120', 130', 140', and/or 150' and, therefore, the appropriate cores. Consequently, using the method 210, multiple slave TAP controller(s) 120', 130', 140', and/or 150' can directly receive test data in parallel. Thus, a constant latency can be achieved and the cores can be tested more rapidly. As a result, efficiency of testing can be improved.

A method and system has been disclosed for testing integrated circuits. Software written according to the present invention is to be stored in some form of computer-readable medium, such as memory, CD-ROM or transmitted over a network, and executed by a processor. Consequently, a computer-readable medium is intended to include a computer readable signal which, for example, may be transmitted over a network. Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A system for testing a plurality of cores in an integrated circuit comprising:
    a plurality of slave controllers, each of the plurality of slave controllers for testing at least one of the plurality of cores; and
    a master controller coupled with the plurality of slave controllers in a star configuration, the master controller configured to allow test data to be input directly to a portion of the plurality of slave controllers in parallel, the portion of the plurality of slave controllers including more than one slave controller;
    at least one AND gate coupled between the master controller and the plurality of slave controllers; and
    wherein the master controller allows the test data to be input directly to the portion of the plurality slave controllers by activating a portion of the at least one AND gate for the portion of the plurality of slave controllers.

2. The system of claim 1 further comprising:
    at least one test data input coupled to the at least one AND gate.

3. The system of claim 1 wherein the master controller enables the portion of the at least one AND gate by providing an encoded address to an instruction register, the encoded address indicating the portion of the plurality of slave controllers.

4. The system of claim 3 wherein the encoded address includes a broadcast bit and a mask, the mask indicating the portion of the plurality of slave controllers.

5. The system of claim 4 wherein the master controller is further configured to enable a single slave controller.

6. The system of claim 1 wherein the master controller is a master TAP controller and wherein the plurality of slave controllers further includes a plurality of slave TAP controllers.

7. A system for testing a plurality of cores in an integrated circuit comprising:
    a plurality of slave controllers, each of the plurality of slave controllers for testing at least one of the plurality of cores;
    a master controller coupled with the plurality of slave controllers in a star configuration, the master controller configured to allow test data to be input directly to a portion of the plurality of slave controllers in parallel, the portion of the plurality of slave controllers including more than one slave controller;
    a plurality of AND gates coupled between the plurality of slave controllers and the master controller; and
    at least one test data input coupled with the plurality of AND gates, the master controller configured to provide an encoded address to enable a portion of the plurality of AND gates to couple a portion of the plurality of slave controllers to the at least one test data input in parallel, thereby allowing the test data to be input directly to the portion of the plurality of slave controllers in parallel, the portion of the plurality of slave controllers including more than one slave controller.

8. A method for testing a plurality of cores in an integrated circuit, the plurality of cores being coupled with a plurality of slave controllers, the plurality of controllers coupled with a master controller in a star configuration, the plurality of slave controllers and the master controller being used in testing the plurality of cores, the method comprising:

enabling a portion of the plurality of slave controllers to be able to directly receive test data in parallel, the portion of the plurality of slave controllers including more than one slave controller, the enabling including providing an encoded address, the encoded address providing further including providing a broadcast bit, the broadcast bit indicating whether the more than one of the plurality of slave controllers is to be enabled;

if more than one slave controller is to be enabled, providing a mask indicating the portion of the plurality of slave controllers:

providing the test data directly to the portion of the plurality of slave controllers while all of the portion of the plurality of slave controllers is enabled.

9. The method of claim 8 wherein the encoded address providing further includes the step of:

if only one slave controller is to be enabled, providing an address for a particular slave controller.

10. The method of claim 8 wherein the master controller includes a master TAP controller and wherein the plurality of slave controllers includes a plurality of slave TAP controllers.

11. The method of claim 8 wherein the data providing step further includes:

providing the test data to the portion of the plurality of slave controllers in parallel.

12. A method for testing a plurality of cores in an integrated circuit, the plurality of cores being coupled with a plurality of slave controllers, the plurality of controllers coupled with a master controller in a star configuration, the plurality of slave controllers and the master controller being used in testing the plurality of cores, the method comprising:

enabling portion of the plurality of slave controllers to be able to directly receive test data in parallel, the portion of the plurality slave controllers including more than one slave controller; and providing the test data directly to the portion of the plurality of slave controllers while all of the portion of the plurality of slave controllers is enabled;

wherein at least one AND gate is coupled between the master controller and the plurality of slave controllers, and wherein the enabling further includes:

enabling a portion of the at least one AND gate for the portion of the plurality of slave controllers.

13. A method for providing system for testing a plurality of cores in an integrated circuit, the method comprising:

providing a plurality of slave controllers, each of the plurality of slave controllers for testing at least one of the plurality of cores;

providing a master controller coupled with the plurality of slave controllers in a star configuration the master controller configured to allow test data to be input directly to a portion of the plurality of slave controllers in parallel, the portion of the plurality of slave controllers including more than one slave controller; and (c) providing at least one AND gate coupled between the master controller and the plurality of slave controllers;

wherein the master controller the test data to be input directly to the portion of the plurality of slave controllers by activating a portion of the at least one AND gate for the portion of the plurality of slave controllers.

14. The method of claim 13 further comprising:

providing at least one test data input coupled to the at least one AND gate.

15. The method of claim 13 wherein the master controller providing step further includes:

configuring the master controller to enables the portion of the at least one AND gate by providing an encoded address to an instruction register, the encoded address indicating the portion of the plurality of slave controllers.

16. The method of claim 15 wherein the encoded address includes a broadcast bit and a mask, the mask indicating the portion of the plurality of slave controllers.

17. The method of claim 16 wherein the master controller providing step further includes:

configuring the master controller to allow the master controller to enable a single slave controller.

* * * * *